US012588567B2

(12) United States Patent
Jang et al.

(10) Patent No.: US 12,588,567 B2
(45) Date of Patent: Mar. 24, 2026

(54) SEMICONDUCTOR PACKAGE

(71) Applicant: Samsung Electronics Co., Ltd.,
Suwon-si (KR)

(72) Inventors: Aenee Jang, Suwon-si (KR); Wonil Lee, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 436 days.

(21) Appl. No.: 18/356,289

(22) Filed: Jul. 21, 2023

(65) Prior Publication Data

US 2024/0038728 A1     Feb. 1, 2024

(30) Foreign Application Priority Data

Jul. 26, 2022     (KR) ........................ 10-2022-0092676

(51) Int. Cl.
    *H01L 25/065*     (2023.01)
    *H01L 23/00*     (2006.01)
    (Continued)

(52) U.S. Cl.
    CPC ...... *H01L 25/0657* (2013.01); *H01L 23/3107* (2013.01); *H01L 23/544* (2013.01); *H01L 24/05* (2013.01); *H01L 24/08* (2013.01); *H10B 80/00* (2023.02); *H01L 24/32* (2013.01); *H01L 24/96* (2013.01); *H01L 24/97* (2013.01);
    (Continued)

(58) Field of Classification Search
    CPC ............. H01L 25/0657; H01L 23/3107; H01L 2224/08145; H01L 2224/32221; H01L 24/80; H01L 24/05; H01L 24/08; H01L 2224/05147; H01L 2224/08123; H01L 2224/08146; H01L 2224/08501
    See application file for complete search history.

(56) References Cited

U.S. PATENT DOCUMENTS 9,299,736 B2     3/2016  Chen et al.
9,312,229 B2     4/2016  Chen et al.
    (Continued)

FOREIGN PATENT DOCUMENTS

KR     10-1999-0018678  A     3/1999
KR     10-2020-0047841  A     5/2020

*Primary Examiner* — Mamadou L Diallo
(74) *Attorney, Agent, or Firm* — Wolf, Greenfield & Sacks, P.C.

(57)     ABSTRACT

A semiconductor package includes a first semiconductor chip, a plurality of second semiconductor chips stacked on the first semiconductor chip, and having widths narrower than a width of the first semiconductor chip, and a molded layer on an upper surface of the first semiconductor chip. The first semiconductor chip includes first front-surface pads, a first back-surface insulating layer divided into a first region and a second region, first back-surface pads in the first region, dummy pads in the second region, the dummy pads respectively having an upper surface on which a metal oxide film is disposed, and a first through-electrode electrically connecting the first front-surface pads and the first back-surface pads to each other. The plurality of second semiconductor chips respectively includes second front-surface pads, second back-surface pads, and a second through-electrode electrically connecting the second front-surface pads and the second back-surface pads to each other.

20 Claims, 13 Drawing Sheets

500A

(51) Int. Cl.
    *H01L 23/31*        (2006.01)
    *H01L 23/544*      (2006.01)
    *H10B 80/00*       (2023.01)

(52) U.S. Cl.
    CPC ............... *H01L 2223/54426* (2013.01); *H01L 2224/05147* (2013.01); *H01L 2224/08145* (2013.01); *H01L 2224/08225* (2013.01); *H01L 2224/32221* (2013.01); *H01L 2224/96* (2013.01); *H01L 2224/97* (2013.01); *H01L 2225/06541* (2013.01); *H01L 2225/06593* (2013.01); *H01L 2924/1431* (2013.01); *H01L 2924/1436* (2013.01); *H01L 2924/1437* (2013.01); *H01L 2924/1441* (2013.01)

(56) References Cited

U.S. PATENT DOCUMENTS

| | | |
|---|---|---|
| 10,141,391 B2 | 11/2018 | Yang |
| 10,748,851 B1 | 8/2020 | Wang et al. |
| 10,861,808 B2 | 12/2020 | Chen et al. |
| 2016/0093597 A1 | 3/2016 | Chang et al. |
| 2019/0355706 A1 | 11/2019 | Enquist et al. |
| 2020/0176384 A1 | 6/2020 | Wu et al. |
| 2021/0082846 A1* | 3/2021 | Lin ...................... H01L 21/561 |
| 2022/0013502 A1 | 1/2022 | Lee et al. |
| 2022/0037273 A1 | 2/2022 | Park et al. |
| 2022/0077116 A1 | 3/2022 | Park et al. |
| 2024/0021488 A1* | 1/2024 | Sun ..................... H01L 25/0657 |

\* cited by examiner

500

'A1'

'A2'

'B'

500B 120 110 162 154 100 180

264
220
210

257
256
190

256 270 252

'C'

SEMICONDUCTOR PACKAGE

CROSS-REFERENCE TO RELATED APPLICATION(S)

This application claims benefit of priority to Korean Patent Application No. 10-2022-0092676 filed on Jul. 26, 2022, in the Korean Intellectual Property Office, the disclosure of which is incorporated herein by reference in its entirety.

BACKGROUND

The present disclosure relates to a semiconductor package.

Electronic devices have been reduced in size and weight in accordance with the development of the electronics industry and user demands, and semiconductor packages used in the electronic devices may be required to provide high performance and high capacitance along with reduction in size and weight. To implement high performance and high capacitance along with reduction in size and weight, semiconductor chips, including through-silicon vias (TSVs) and semiconductor packages in which the semiconductor chips are stacked, have been continuously researched and developed.

SUMMARY

An aspect of the present disclosure provides a semiconductor package having improved reliability capable of ensuring a connection between semiconductor chips and having a generally strong bonding strength.

According to an aspect of the present disclosure, there is provided a semiconductor package including a first semiconductor chip, a plurality of second semiconductor chips stacked on the first semiconductor chip, the plurality of second semiconductor chips respectively having widths narrower than a width of the first semiconductor chip, and a molded layer on an upper surface of the first semiconductor chip, the molded layer on side surfaces of the plurality of second semiconductor chips. The first semiconductor chip may include a first semiconductor substrate, a first semiconductor device layer on a front surface of the first semiconductor substrate, first front-surface pads on the first semiconductor device layer, a first back-surface insulating layer on a back surface of the first semiconductor substrate and divided into a first region and a second region, first back-surface pads in the first region of the first back-surface insulating layer, dummy pads in the second region of the first back-surface insulating layer, the dummy pads respectively having an upper surface with a metal oxide film thereon, and a first through-electrode extending through the first semiconductor substrate and electrically connecting the first front-surface pads and the first back-surface pads to each other. The plurality of second semiconductor chips may respectively include a second semiconductor substrate, a second semiconductor device layer on a front surface of the second semiconductor substrate, a second front-surface insulating layer on the second semiconductor device layer, second front-surface pads in the second front-surface insulating layer, a second back-surface insulating layer on a back surface of the second semiconductor substrate, second back-surface pads in the second back-surface insulating layer, and a second through-electrode extending through the second semiconductor substrate and electrically connecting the second front-surface pads and the second back-surface pads to each other. A second front-surface insulating layer of a lowermost second semiconductor chip among the plurality of second semiconductor chips may be bonded to the first back-surface insulating layer. Second front-surface pads of the lowermost second semiconductor chip may be bonded to the first back-surface pads, respectively.

According to another aspect of the present disclosure, there is provided a semiconductor package including a base structure having an upper surface divided into a first region and a second region, the base structure including a base insulating layer on the upper surface, connection pads bordered by the base insulating layer and arranged on the first region, and dummy pads bordered by the base insulating layer, arranged on the second region, respectively having an upper surface on which a metal oxide film is, at least one semiconductor chip on the first region of the base structure, the at least one semiconductor chip including a semiconductor substrate, a semiconductor device layer on a front surface of the semiconductor substrate, a front-surface insulating layer on the semiconductor device layer and bonded to the base insulating layer in the first region, and front-surface pads bordered by the front-surface insulating layer and respectively bonded to the connection pads, and a molded layer on the base structure and bordering side surfaces of the at least one semiconductor chip.

According to another aspect of the present disclosure, there is provided a semiconductor package including a first semiconductor chip having an upper surface and a lower surface, the upper surface being divided into a first region and a second region bordering the first region, a plurality of second semiconductor chips stacked on the first region of the upper surface of the first semiconductor chip, the plurality of second semiconductor chips being a same type of semiconductor chip, which is different from that of the first semiconductor chip, and a molded layer on the first semiconductor chip and bordering side surfaces of the plurality of second semiconductor chips. The first semiconductor chip may include a protective layer on a lower surface of the first semiconductor chip, external connection pads disposed on the protective layer, a first upper insulating layer on an upper surface of the first semiconductor chip, first upper pads on the first region of the upper surface in the first upper insulating layer, dummy pads on the first region of the upper surface in the first upper insulating layer, and metal oxide films on the dummy pads, respectively. The plurality of second semiconductor chips may respectively include a semiconductor substrate, a semiconductor device layer on a front surface of the semiconductor substrate, a front-surface insulating layer on the semiconductor device layer, front-surface pads disposed in the front-surface insulating layer, a back-surface insulating layer on a back surface of the semiconductor substrate, back-surface pads in the back-surface insulating layer, and a through-electrode extending through the semiconductor substrate and electrically connecting the front-surface pads and the back-surface pads to each other. A front-surface insulating layer of a lowermost second semiconductor chip among the plurality of second semiconductor chips may be bonded to first the upper insulating layer, and front-surface pads of the lowermost second semiconductor chip may be respectively bonded to the first upper pads.

When a semiconductor chip is mounted on a base structure (for example, a chip or a substrate) having a relatively large size, a dummy pad (for example, Cu) may be formed in an unmounted upper surface region to improve planarization quality of a bonding surface of the base structure. In addition, a metal oxide film (for example, Cu oxide) may be disposed on the dummy pad, thereby improving reliability issues, which may be caused by a decrease in bonding strength with a molded layer (for example, EMC) due to the introduction of the dummy pad.

The various and beneficial advantages and effects of example embodiments are not limited to the above description, and will be more easily understood in the course of describing specific example embodiments.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
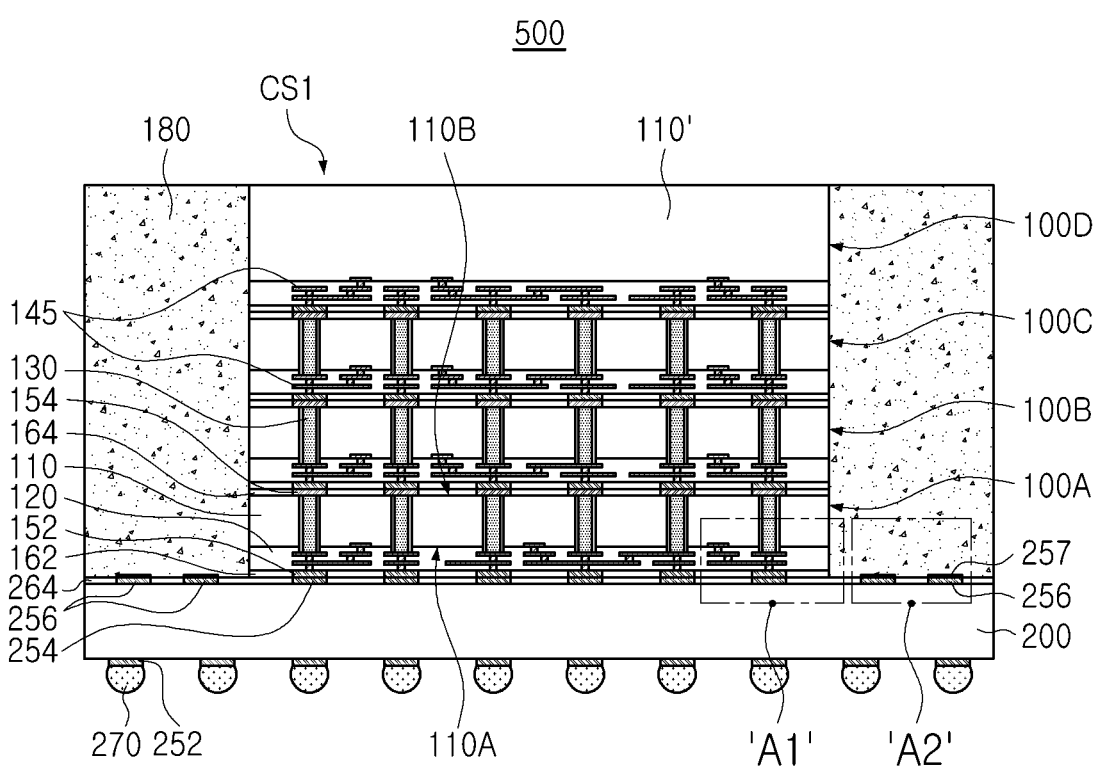
FIG. 1 is a side cross-sectional view illustrating a semiconductor package according to an example embodiment of the present disclosure.

Hereinafter, example embodiments of the present disclosure will be described with reference to the accompanying drawings. The present disclosure may, however, be embodied in many different forms and should not be construed as limited to the embodiments set forth herein. Like reference numerals refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
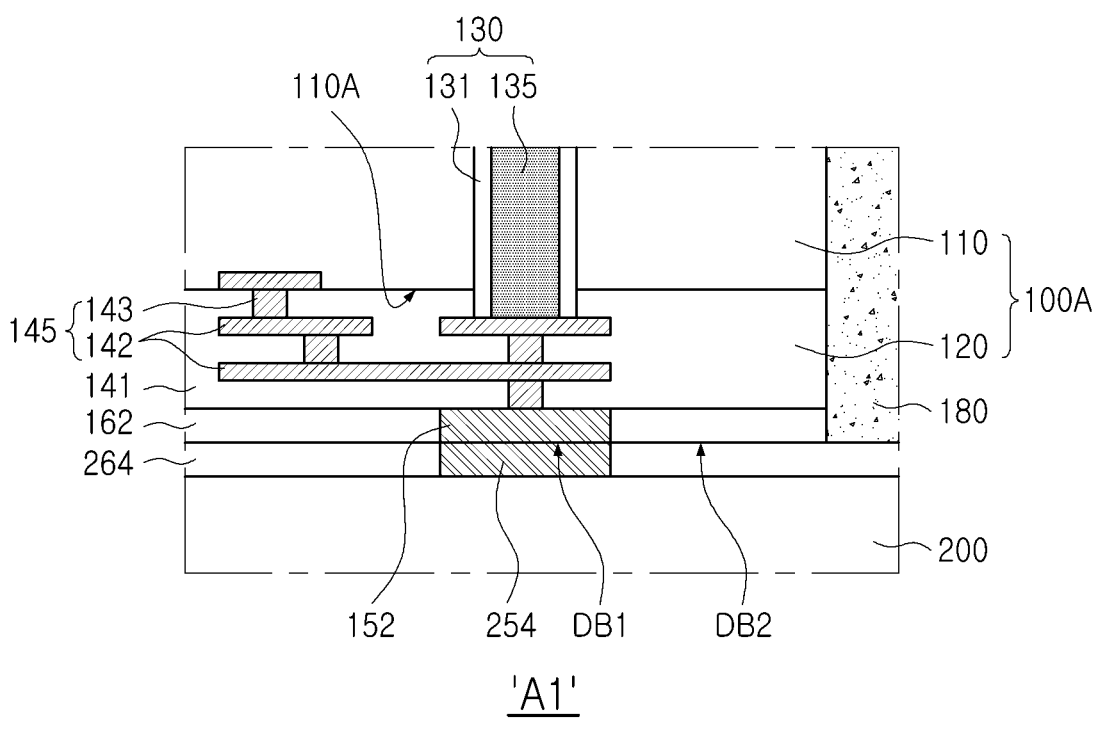
FIGS. 2 and 3 are partially enlarged views illustrating portions "A1" and "A2" of the semiconductor package of FIG. 1, respectively.
Figure 3:
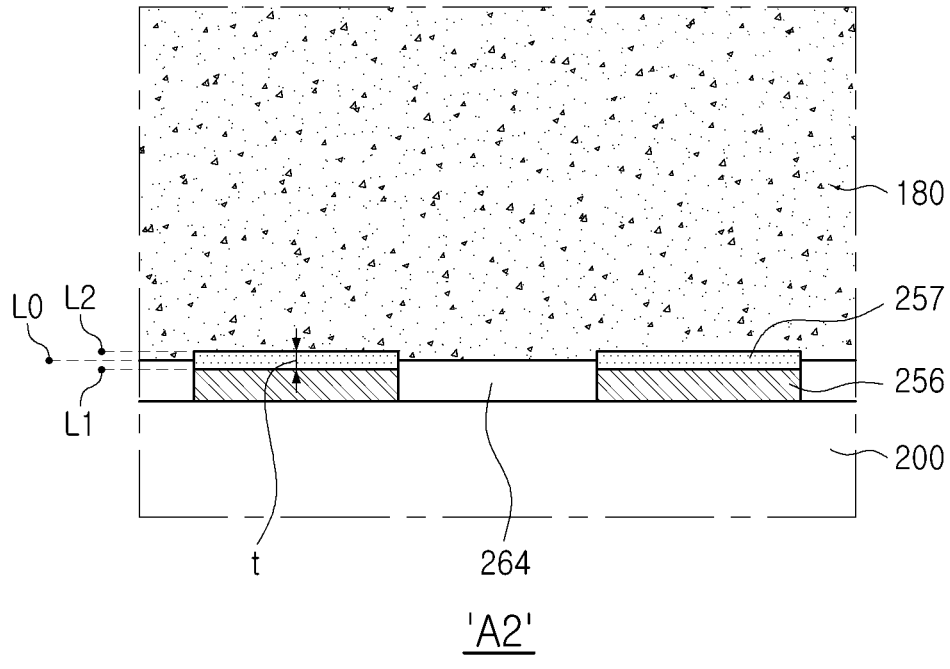

FIG. 1 is a side cross-sectional view illustrating a semiconductor package according to an example embodiment of the present disclosure. FIGS. 2 and 3 are partially enlarged views illustrating portions "A1" and "A2" of the semiconductor package of FIG. 1, respectively.

Referring to FIG. 1, a semiconductor package 500 according to the present example embodiment may include a base structure 200 and a chip stack CS1 disposed on the base structure 200. The chip stack CS1 may include a first semiconductor chip 100A, a second semiconductor chip 100B, a third semiconductor chip 100C, and a fourth semiconductor chip 100D stacked in a direction perpendicular to an upper surface of the base structure 200.

Figure 4:
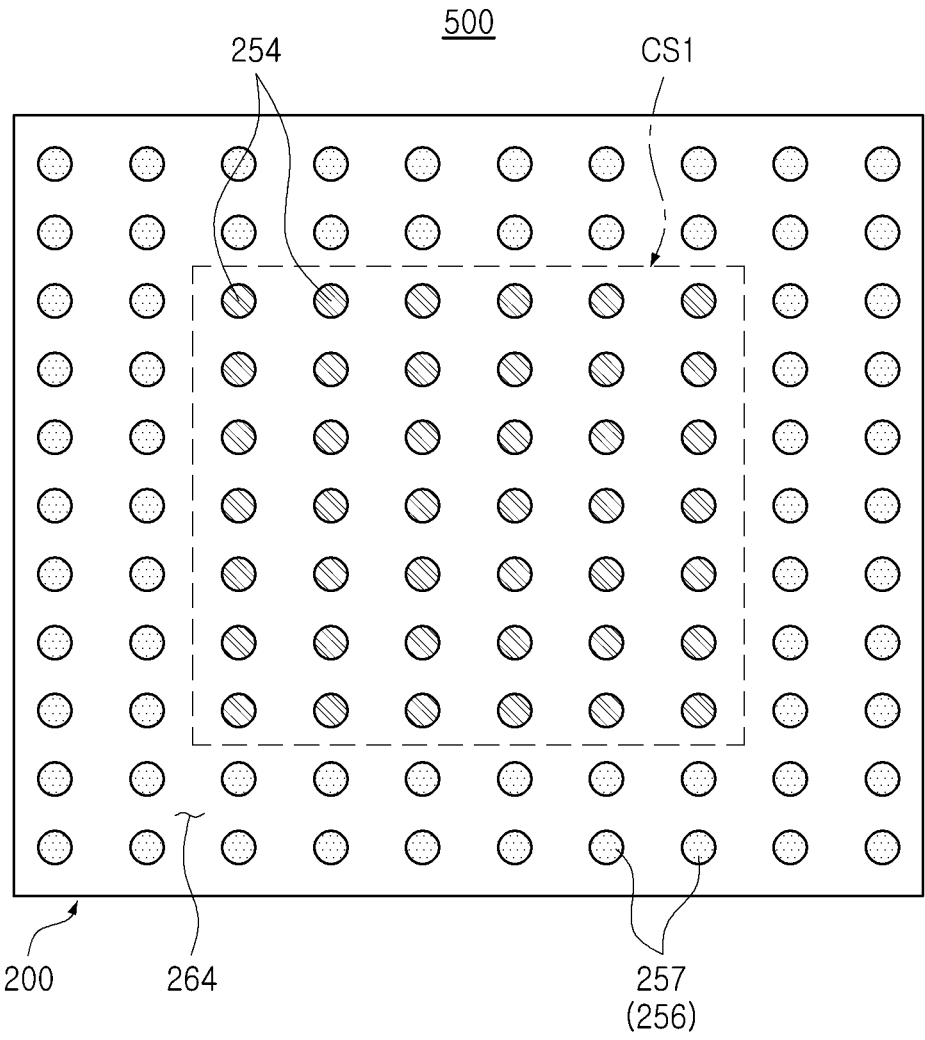
FIG. 4 is a top plan view illustrating a base structure used in the semiconductor package of FIG. 1.

In the present example embodiment, the base structure 200 may have an upper surface divided into a first region disposed in the chip stack CS1 and a second region around the first region. As illustrated in FIG. 4, the second region may be disposed to border or surround the first region when viewed in a plan view. Specifically, the first to fourth semiconductor chips 100A, 100B, 100C, and 100D may have the same area, while the base structure 200 may have an area larger than that of semiconductor chips. The base insulating layer 264 may also have a region not covered by or free of the semiconductor chips.

The base structure 200 may include a base insulating layer 264 disposed on the upper surface thereof, connection pads 254 disposed on the first region in the base insulating layer 264, and dummy pads 256 disposed on the second region in the base insulating layer 264.

The connection pads 254 and the dummy pads 256 may be disposed to be bordered or surrounded by the base insulating layer 264, respectively, in a plan view of the semiconductor package 500. The connection pads 254 may have an upper surface substantially coplanar with an upper surface of the base insulating layer 264. The connection pads 254 may be arranged to correspond to front-surface pads 152 of a lowest semiconductor chip among a plurality of semiconductor chips, that is, the first semiconductor chip 100A. Similarly, the front-surface pads 152 of the first semiconductor chip 100A may have an upper surface substantially coplanar with an upper surface of a front-surface insulating layer 162. The coplanar upper surfaces may be provided as bonding surfaces of the base structure 200 and the first semiconductor chip 100A.

Referring to FIG. 2, the upper surface of the base structure 200 and a lower surface of the first semiconductor chip 100A may be directly bonded to each other. Specifically, the connection pads 254 of the base structure 200 and the front-surface pads 152 of the first semiconductor chip 100A may be directly bonded to each other to form a metal-to-metal bonding DB1. Accordingly, the base structure 200 and the first semiconductor chip 100A may be mechanically fixed to each other, together with electrical connection between the base structure 200 and the first semiconductor chip 100A.

The connection pads 254 and the front-surface pads 152 may respectively include the same metal, for example, copper (Cu). The connection pads 254 and the front-surface pads 152 being in direct contact with each other may be bonded to each other by interdiffusion of copper through a high-temperature annealing process. A metal included in the connection pads 254 and the front-surface pads 152 is not limited to copper, and may include any mutually couplable material (for example, Au) in accordance with different embodiments.

Through the metal bonding DB1, the base structure 200 and the first semiconductor chip 100A may be firmly bonded to each other, and an electrical/mechanical connection may be achieved without a conductive bump (for example, a microbump). A path for transmitting and receiving a control signal, a power signal, a ground signal, and/or a data signal may be provided between the base structure 200 and the first semiconductor chip 100A. It may not be necessary to go through the conductive bump, thereby reducing transmission loss.

In a similar manner to the metal bonding DB1, the base insulating layer 264 may be directly bonded to a front-surface insulating layer 152 positioned on the lower surface of the first semiconductor chip 100A to form a dielectric-to-dielectric bonding DB2.

The base insulating layer 264 of the base structure 200 and the front-surface insulating layer 162 of the first semiconductor chip 100A may be formed of the same material. For example, the base insulating layer 264 and the front-surface insulating layer 162 may include silicon oxide. In a state in which the base insulating layer 264 and the front-surface insulating layer 162 are in direct contact with each other, the high-temperature annealing process may be performed. The base insulating layer 264 and the front-surface insulating layer 162 may be firmly bonded to each other by a covalent bond. A dielectric material included in the base insulating layer 264 and the front-surface insulating layer 162 is not limited to silicon oxide, and may include any mutually couplable material (for example, SiCN) in accordance with different embodiments.

Thus, in the present example embodiment, bonding between the base structure 200 and the first semiconductor chip 100A may have the dielectric bonding DB2 between the base insulating layer 264 and the front-surface insulating layer 162, together with the metal bonding DB1 between the connection pads 254 and the front-surface pads 152, and such bonding may be referred to as "hybrid bonding."

As described above, on the upper surface of the base structure 200, the dummy pads 256 may be arranged on a region around the chip stack CS1, that is, on the second region. The dummy pads 256 may be pads not electrically connected to an internal wiring of the base structure 200. In a similar manner to the first region on which the connection pads 254 are disposed, the dummy pad 256 may be formed on the second region, thereby reducing or preventing local dielectric erosion due to a difference in pad density during a planarization process for the bonding surface. Accordingly, planarization quality of the bonding surface (that is, the upper surface) of the base structure 200 may be improved, which may thereby provide excellent direct bonding in which an undesired void does not occur at a bonding interface. The dummy pads 256 may be manufactured in the same process as that of the connection pads 254. In some example embodiments, the dummy pads 256 may include a metal the same as that of the connection pads 254. For example, the dummy pads 256 and the connection pads 254 may include copper, respectively.

Referring to FIGS. 2 and 3, a metal oxide film may be formed on each of the dummy pads 256. A metal oxide film 257 may be in direct contact with a molded layer 180. The molded layer 180 may be formed on the base structure 200 to seal at least a portion of the chip stack CS1. In the present example embodiment, the molded layer 180 may be formed to border or surround side surfaces of the chip stack CS1 to open an upper surface of the chip stack CS1. The molded layer 180 used in the present example embodiment may include a single or monolithic structure formed of a single material. For example, the molded layer 180 may include an epoxy molding compound (EMC). As illustrated in FIG. 3, the molded layer 180 may be disposed on the base structure 200, and may have a surface substantially coplanar with side surfaces of the base structure 200. The coplanar side surfaces may be understood as being side surfaces obtained by the same cutting process.

The dummy pads 256 may be formed of a metal material having a substantially coplanar upper surface, such that bonding strength with the molded layer 180, such as the EMC, may be relatively low. In particular, due to stress concentrated at a triple point at which the base structure 200, the first semiconductor chip 100A, and the molded layer 180 meet, the molded layer 180 may be peeled off from the second region of the upper surface of the base structure 200. Thus, the dummy pads 256 introduced for planarization quality may act as a factor inducing such peeling.

To address such an issue, the metal oxide film 257 may be disposed on the dummy pads 256. Thus, instead of the dummy pads 256, the metal oxide film 257 may be configured to be in direct contact with the molded layer 180, thereby increasing bonding strength between the second region of the base structure 200 and the molded layer 180. The effect of improving the bonding strength may vary depending on a thickness t of the metal oxide film 257.

Figure 5:
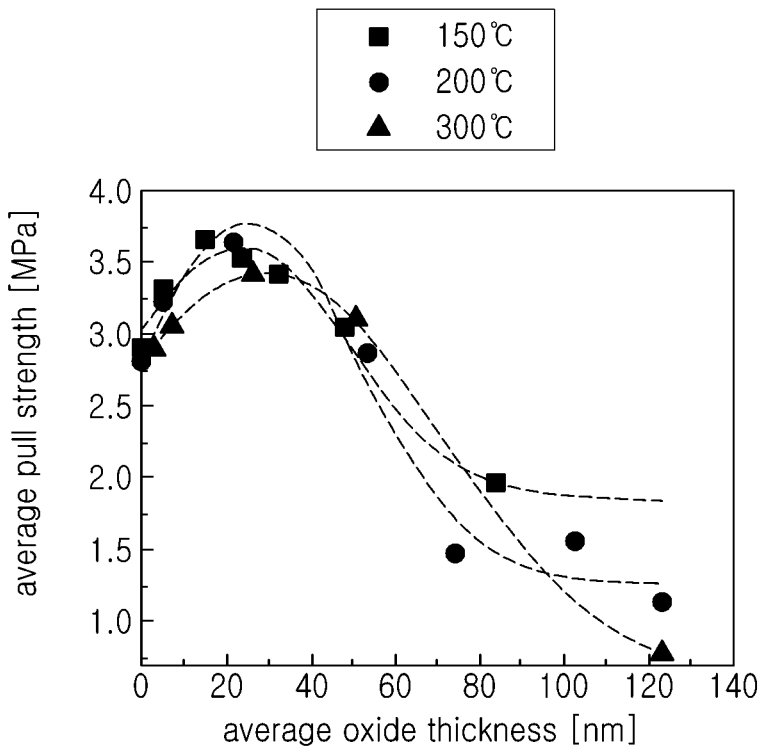
FIG. 5 is a graph illustrating bonding strength with a molded layer according to a thickness of a metal oxide film on a dummy pad.

FIG. 5 is a graph illustrating bonding strength with a molded layer according to a thickness of a metal oxide film on a dummy pad (source: The Influence of Leadframe oxidation on the Cu/EMC Interface Adhesion Effect of copper oxide on the adhesion behavior of Epoxy Molding Compound-Copper Interface, IEEE 2002).

FIG. 5 illustrates a change in bonding strength with the EMC molded layer 180 according to an average thickness of a copper oxide film 257 on a copper dummy pad 256 at different temperatures (150° C., 200° C., and 300° C.).

When the thickness t of the metal oxide film 257 is about 80 nm or less, generally high bonding strength was exhibited. For a stable improvement effect (a minimum thickness), the thickness t of the metal oxide film 257 may be in a range of about 5 nm to about 80 nm. In some example embodiments, relatively high bonding strength may be expected by adjusting the thickness t of the metal oxide film 257 to about 10 nm to about 40 nm.

The metal oxide film 257 may include oxide containing a metal included in the dummy pad 256. For example, in a series of stacking processes, the dummy pad 256 may be exposed and the metal oxide film 257 may be understood as a product formed by reacting oxygen in contact with the metal of the dummy pad 256 (see FIGS. 12B and 12C). In some example embodiments, as described above, the connection pads 254 may have an upper surface coplanar with the upper surface of the base insulating layer 264. Conversely, as illustrated in FIG. 3, a level L2 of the upper surface of the metal oxide film 257 may be higher than a level L0 of the upper surface of the base insulating layer 264. Some metals of the dummy pad may react while the metal oxide film is formed, such that a level L1 of a lower surface of the metal oxide film may be lower than the level L0 of the upper surface of the base insulating layer 264. In some example embodiments, the metal oxide film 257 may have a relatively small thickness, and thus it may be difficult to compare and determine levels.

In the present example embodiment, as illustrated in FIG. 4, a size and pitch of the dummy pads 256 may have an arrangement substantially the same as that of a size and pitch of the connection pads 254. That is, a density of the dummy pads 256 (a sum of areas of dummy pads compared to an area of a second region) may be substantially equal to a density of the connection pads 254 (a sum of areas of connection pads compared to an area of a first region). In some example embodiments, at least one of the size and pitch of the dummy pads 256 may be arranged to be different from that of the connection pads 254 within a predetermined range (see FIGS. 8 and 11).

The first to fourth semiconductor chips 100A, 100B, 100C, and 100D included in the chip stack CS1 may have a front surface (or "lower surface") and a back surface (or "upper surface") opposite to each other, respectively, and may be stacked such that different surfaces (that is, the back surface and the front surface) oppose each other. The first to fourth semiconductor chips 100A, 100B, 100C, and 100D may include a semiconductor substrate 110, a semiconductor device layer 120, a through-electrode 130, a front-surface pad 152, and a back-surface pad 154. However, as in the present example embodiment, a semiconductor chip (that is, the fourth semiconductor chip 100D) disposed on an uppermost level may not include the through-electrode 130.

Referring to FIGS. 1 and 2, the semiconductor device layer 120 may be disposed on a lower surface of each semiconductor substrate 110. For example, the semiconductor substrate 110 may include silicon or a compound semiconductor, such as SiC, SiGe, or GaAs. The semiconductor substrate 110 may have a conductive region, for example, a well doped with an impurity, or an active surface on which a structure doped with an impurity is formed. In addition, the semiconductor substrate 110 may have various device isolation structures, such as a shallow trench isolation (STI) structure.

The semiconductor device layers 120 may be formed to include a plurality of individual devices and a wiring layer 145 formed on the active surface of the semiconductor substrate 110. The wiring layer 145 may include a metal wiring layer 142 and a via 143, and may be formed in a wiring insulating layer 141. For example, the wiring layer 145 may be a multilayer wiring in which two or more metal wiring layers 142 and/or two or more vias 143 are alternately stacked. The wiring layer 145 may be connected to the front-surface pad 152 disposed on a front surface of each of the first to fourth semiconductor chips 100A, 100B, 100C, and 100D.

The through-electrode 130 may be formed to pass or extend through the semiconductor substrate 110. At least a portion of the through-electrode 130 may have a pillar shape. The through-electrode 130 may include a via plug 135 and a side-surface insulating film 131 surrounding the via plug 135. The side-surface insulating film 131 may electrically isolate the via plug 135 from the semiconductor substrate 110 and the semiconductor device layer 120. As described above, the fourth semiconductor chip 100D disposed on the uppermost level may not include the through-electrode 130. The through-electrode 130 may be connected to the back-surface pad 154 disposed on a back surface of each of the first to third semiconductor chips 100A, 100B, and 100C. In addition, the through-electrode 130 may be connected to the wiring layer 145 connected to the front-surface pads 152.

Thus, in each of the first to third semiconductor chips 100A, 100B, and 100C, the through-electrode 130 may electrically connect the front-surface pad 152 and the back-surface pad 154 to each other.

The first to fourth semiconductor chips 100A, 100B, 100C, and 100D may be stacked on each other by the above-described hybrid bonding between adjacent semiconductor chips.

Specifically, the back-surface pads 154 of the first to third semiconductor chips 100A, 100B, and 100C may be directly bonded to the front-surface pads 152 of the second to fourth semiconductor chips 100B, 100C, and 100D, respectively. Specifically, as illustrated in FIG. 2, the back-surface pad 154 and the front-surface pad 152 may be directly bonded to each other between the adjacent first and second semiconductor chips 100A and 100B to provide metal bonding, thereby fixing the first and second semiconductor chips 100A and 100B to each other, together with electrical connection between the first and second semiconductor chips 100A and 100B. Similarly, metal bonding between the back-surface pad 154 and the front-surface pad 152 may be formed between the second semiconductor chip 100B and the third semiconductor chip 100C, and between the third semiconductor chip 100C and the fourth semiconductor chip 100D.

The back-surface pad 154 and the front-surface pad 152 may include the same metal, for example, copper (Cu). The back-surface pad 154 and the front-surface pad 152 being in direct contact with each other may be coupled to each other by interdiffusion of copper through a high-temperature annealing process. A metal included in the back-surface pad 154 and the front-surface pad 152 is not limited to copper, and may include any mutually couplable material (for example, Au) in accordance with different embodiments.

Through the metal bonding, the stacked semiconductor chips may be firmly bonded to each other, and an electrical/mechanical connection may be achieved without a conductive bump (for example, a microbump). A path for transmitting and receiving a control signal, a power signal, a ground signal, and/or a data signal may be provided between the first to fourth semiconductor chips 100A, 100B, 100C, and 100D. It may not be necessary to go through the conductive bump, thereby reducing transmission loss.

In the present example embodiment, in a similar manner to the metal bonding, a back-surface insulating layer 164 disposed on an upper surface of each of the first to third semiconductor chips 100A, 100B, and 100C, and a front-surface insulating layer 162 disposed on a lower surface of each of the second to fourth semiconductor chips 100B, 100C, and 100D may be directly bonded each other to form the dielectric bonding DB2. The back-surface insulating layer 164 and the front-surface insulating layer 162 may be formed of the same material. For example, the back-surface insulating layer 164 and the front-surface insulating layer 162 may include silicon oxide. In a state in which the back-surface insulating layer 164 and the front-surface insulating layer 162 are in direct contact with each other, the high-temperature annealing process may be performed. The back-surface insulating layer 164 and the front-surface insulating layer 162 may be firmly bonded to each other by a covalent bond. A dielectric material included in the back-surface insulating layer 164 and the front-surface insulating layer 162 is not limited to silicon oxide, and may include any mutually couplable material (for example, SiCN) in accordance with different embodiments.

Thus, in the present example embodiment, adjacent semiconductor chips may be stacked in a hybrid bonding manner.

The base structure 200 used in the present example embodiment may be a substrate having a wiring circuit or may be a type of semiconductor chip that is different from that of the first to fourth semiconductor chips 100A, 100B, 100C, and 100D.

For example, the base structure 200 may be an interposer having an internal wiring such as a redistribution circuit. When the base structure 200 is an interposer, the base structure 200 may include an internal wiring (not illustrated) connecting a lower surface and an upper surface of a substrate body to each other. For example, the substrate body may be a semiconductor, such as silicon. The base structure 200 may include connection pads 254 disposed on an upper surface thereof and connected to the internal wiring, and external connection pads 252 disposed on a lower surface thereof and connected to the internal wiring, and a conductive bump 270, such as a solder ball may be formed on each of the external connection pads 252. The semiconductor package 500 may be electrically connected to an external device such as a motherboard through the conductive bump 270.

A control signal, a power signal, and/or a ground signal for operating the first to fourth semiconductor chips 100A, 100B, 100C, and 100D may be transmitted from the outside or an external source through the conductive bump 270, a data signal to be stored in the first to fourth semiconductors chips 100A, 100B, 100C, and 100D may be transmitted from the outside or an external source through the conductive bump 270, or data stored in the first to fourth semiconductor chips 100A, 100B, 100C, and 100D may be transmitted to the outside or an external destination through the conductive bump 270.

The first to fourth semiconductor chips 100A, 100B, 100C, and 100D may be memory chips or logic chips. In an example, all of the first to fourth semiconductor chips 100A, 100B, 100C, and 100D may be the same type of memory chip.

For example, the memory chip may be a volatile memory chip, such as dynamic random access memory (DRAM) or static random access memory (SRAM), a non-volatile memory chip, such as phase-change random access memory (PRAM), magnetic random access memory (MRAM), ferroelectric random access memory (FeRAM), or resistive random access memory (RRAM). In some example embodiments, the first to fourth semiconductor chips 100A, 100B, 100C, and 100D may be high bandwidth memory (HBM).

In addition, the logic chip may be, for example, a microprocessor, an analog device, or a digital signal processor. For example, the base structure 200 may be a logic chip configured to control the first to fourth semiconductor chips 100A, 100B, 100C, and 100D.

In the present example embodiment, a semiconductor package 300A in which the first to fourth semiconductor chips 100A, 100B, 100C, and 100D are stacked is illustrated as an example, but the number of semiconductor chips stacked in the semiconductor package 300A is not limited thereto. For example, two, three, or more semiconductor chips, for example, eight (see FIG. 6) may be stacked in the semiconductor package 300A.

The first to fourth semiconductor chips 100A, 100B, 100C, and 100D may be the same type of chip, and may have the same area, as illustrated in FIG. 1. In some example embodiments, the first to fourth semiconductor chips 100A, 100B, 100C, and 100D may have different areas.

Figure 6:
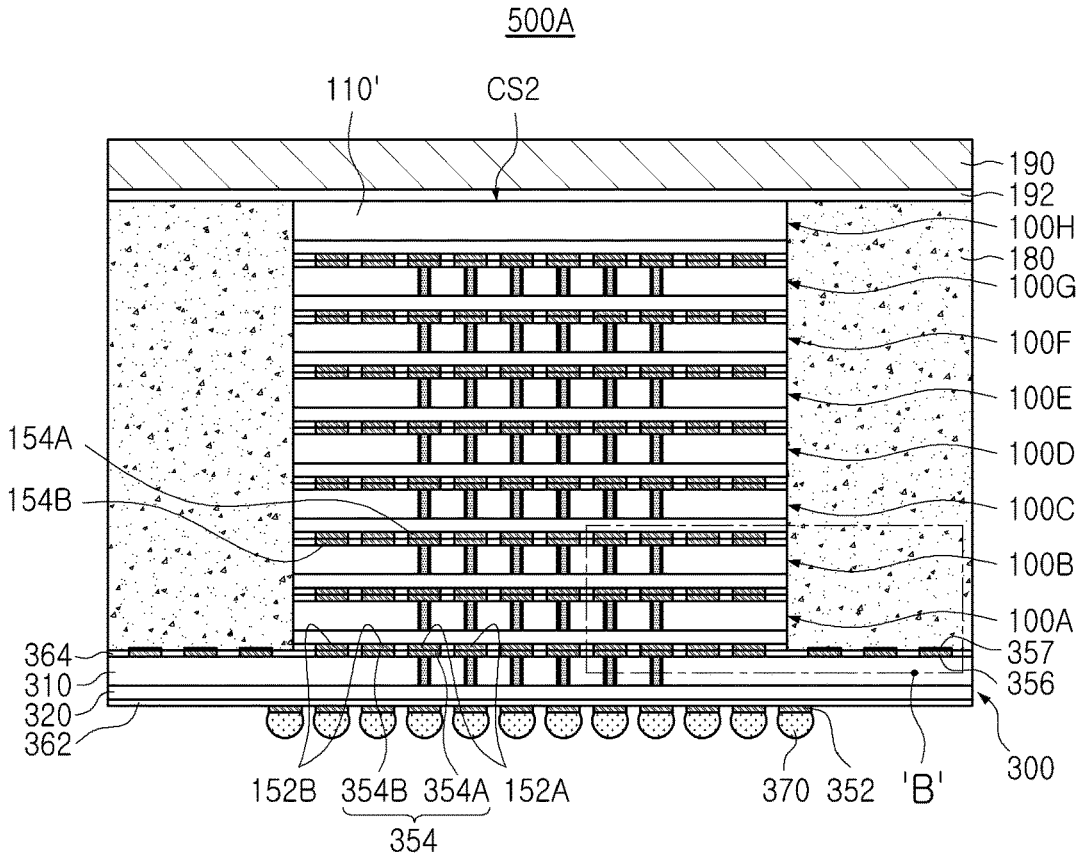
FIG. 6 is a side cross-sectional view illustrating a semiconductor package according to an example embodiment of the present disclosure.
Figure 7:
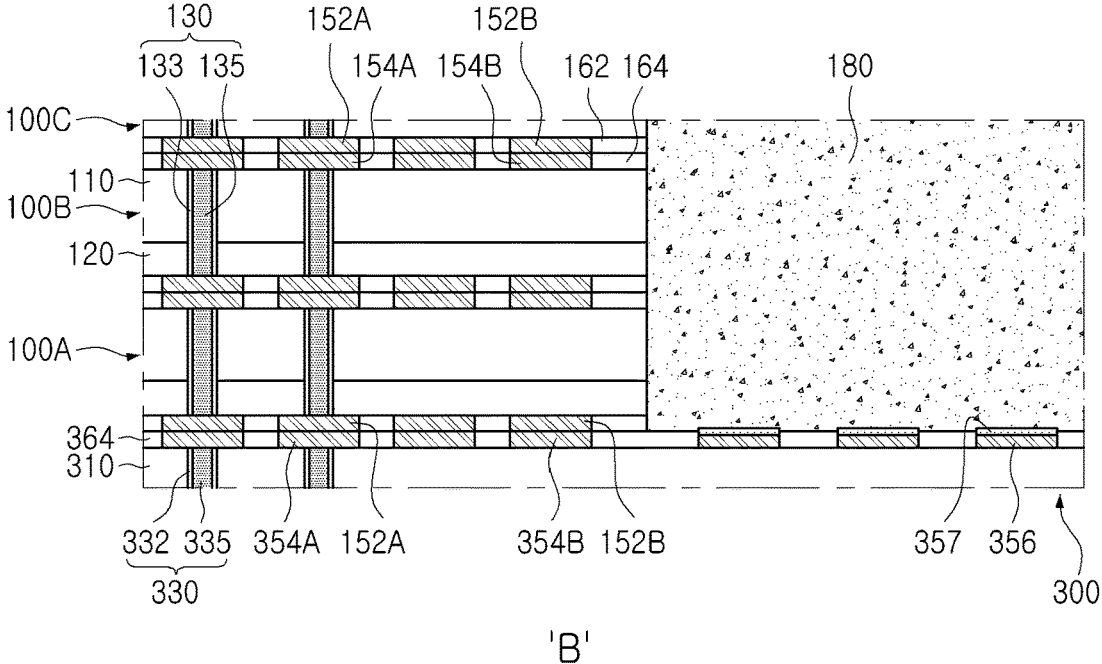
FIG. 7 is a partially enlarged view illustrating a portion "B" in the semiconductor package of FIG. 6.
Figure 8:
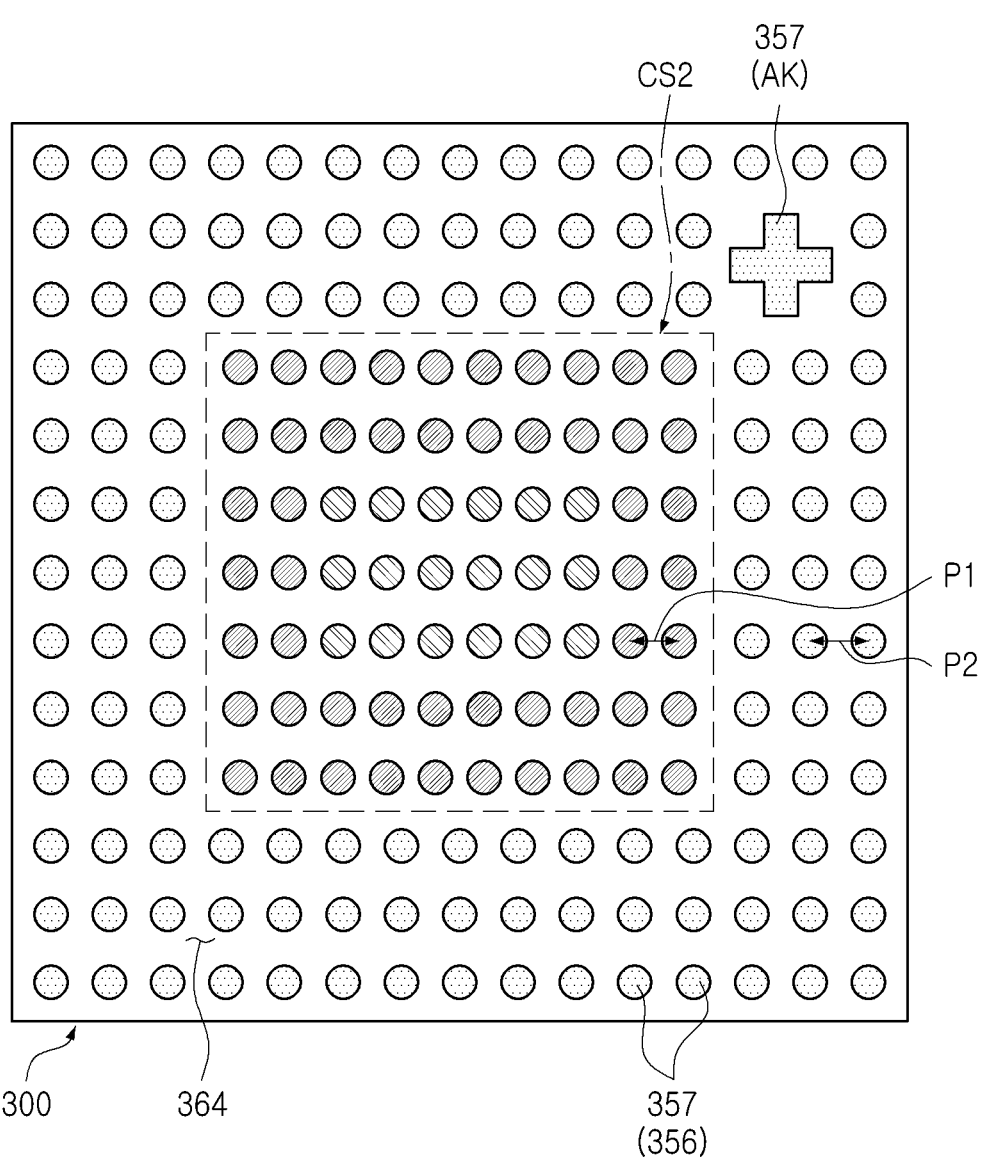
FIG. 8 is a top plan view illustrating a base structure used in the semiconductor package of FIG. 6.

FIG. 6 is a side cross-sectional view illustrating a semiconductor package according to an example embodiment of the present disclosure. FIG. 7 is a partially enlarged view illustrating a portion "B" in the semiconductor package of FIG. 6. FIG. 8 is a top plan view illustrating a base structure used in the semiconductor package of FIG. 6.

Referring to FIGS. 6 to 8, a semiconductor package 500A according to the present example embodiment may be understood as having a structure similar to that in the example embodiments illustrated in FIGS. 1 and 2, except that a first semiconductor chip 300 introduced as a base structure, and a plurality of (eight) second semiconductor chips 100A, 100B, 100C, 100D, 100E, 100F, and 100G sequentially stacked on the first semiconductor chip are included, each of the semiconductor chips (300 and 100A to 100G) has chip dummy pads, and a heat proof plate 190 is included. Accordingly, the description of the example embodiments illustrated in FIGS. 1 and 2 may be combined with the description of the present example embodiment, unless otherwise specified.

In the present example embodiment, the first semiconductor chip 300 having a size larger than that of the plurality of stacked second semiconductor chips may be introduced as the base structure.

The first semiconductor chip 300 may include a first semiconductor substrate 310, a first semiconductor device layer 320 disposed on a front surface (or a lower surface) of the first semiconductor substrate 310, first front-surface pads 352 disposed on the first semiconductor device layer 320, a first back-surface insulating layer 364 disposed on a back surface (or a upper surface) of the first semiconductor substrate 310, first back-surface pads 354A and dummy pads 356 bordered or surrounded by the first back-surface insulating layer 364, and a first through-electrode 330 extending through the first semiconductor substrate 310. The first through-electrode 330 may electrically connect the first front-surface pads 352 and the first back-surface pads 354A to each other. The first semiconductor chip 300 may further include a protective layer 362 disposed on the first semiconductor device layer 320. The first front-surface pads 352 may be formed on the protective layer 362, and may be electrically connected to the first semiconductor device layer 320.

The first back-surface insulating layer 364 may be divided into a first region bonded to a chip stack CS2 of the second semiconductor chips 100A to 100G and a second region bordering or surrounding the first region. First back-surface pads 352 may be disposed in the first region of the first back-surface insulating layer 362, and second back-surface pads 354A may be disposed in the second region of the first back-surface insulating layer 362. In a similar manner to the previous example embodiment, a dummy pad 356 positioned in the second region may suppress the occurrence of local dielectric erosion during a planarization process for a bonding surface.

As a result, planarization quality of a bonding surface (that is, upper surface) of the first semiconductor chip 300 may be improved to provide excellent direct bonding in which an undesired void does not occur at a bonding interface.

In addition, a metal oxide film 357 may be disposed on upper surfaces of the dummy pads 356, in similar manner to the above-described example embodiment. The metal oxide film 357 may be in direct contact with the molded layer 180. Instead of the dummy pads 356, the metal oxide film 357 may be configured to be in direct contact with the molded layer 180, thereby increasing bonding strength between the first semiconductor chip 300 and the molded layer 180.

In the present example embodiment, eight second semiconductor chips 100A to 100G having the same size may be stacked in the first region of the first semiconductor chip 300 to provide the chip stack CS. The plurality of second semiconductor chips 100A to 100G may each have an area smaller than that of the first semiconductor chip 300.

Each of the plurality of second semiconductor chips 100A to 100G may include a second semiconductor substrate 110, a second semiconductor device layer 120 disposed on a front surface (or lower surface) of the second semiconductor substrate 110, a second front-surface insulating layer 162 disposed on the second semiconductor device layer 120, second front-surface pads 152A disposed in the second front-surface insulating layer 162, a second back-surface insulating layer 164 disposed on a back surface (or upper surface) of the second semiconductor substrate 110, second back-surface pads 154A disposed in the second back-surface insulating layer 164, and a second through-electrode 130 extending through the second semiconductor substrate 110 and electrically connecting the second front-surface pads 152A and the second back-surface pads 154A to each other.

In a similar manner to the previous example embodiment, the second front-surface insulating layer 162 of a lowermost second semiconductor chip 100A among the plurality of second semiconductor chips 100A to 100G may be bonded to the first back-surface insulating layer 364, and the second front-surface pads 152A of the lowermost second semiconductor chip 100A may be bonded to the first back-surface pads 354A, respectively. In addition, the second back-surface insulating layer 164 of each of the plurality of second semiconductor chips 100A to 100G may be bonded to the second front-surface insulating layer 162 of another adjacent second semiconductor chip, and the second back-surface pads 154A of each of the plurality of second semiconductor chips 100A to 100G may be bonded to the second front-surface pads 152A of another adjacent semiconductor chip, respectively.

In the present example embodiment, the first semiconductor chip 300 may further include first back-surface dummy pads 354B disposed on a back surface of the first semiconductor substrate 310 in a first region of the first back-surface insulating layer 364. In the present example embodiment, the first back-surface dummy pads 354B may be disposed around the first back-surface pads 354A in the first region. In addition, the plurality of second semiconductor chips 100A to 100G may further include second front-surface dummy pads 152B disposed on a front surface of the second semiconductor substrate 110 in the second front-surface insulating layer 162, and second back-surface dummy pads 154B disposed on a back surface of the second semiconductor substrate 110 in the second back-surface insulating layer 164. In the present example embodiment, the second front-surface dummy pads 152B and the second back-surface dummy pads 154B may be disposed around the second front-surface pads 152A and the second back-surface pads 154A.

The first back-surface dummy pads 354B and the second front-surface dummy pads 152B and the second back-surface dummy pads 154B may be pads not electrically connected to an internal circuit or device of each chip in a similar manner to the dummy pad 356. The first back-surface dummy pads 354B of the first semiconductor chip may be directly bonded to the second back-surface dummy pads 154B of the lowermost second semiconductor chip 100A to ensure more stable bonding. Similarly, even between adjacent second semiconductor chips, the second back-surface dummy pads 154B and the second front-surface dummy pads 152B may be directly bonded to each other to ensure more stable bonding of the chip stack CS2.

In the present example embodiment, the second semiconductor chips 100A to 100G included in the chip stack CS2 may be the same type of memory chip. The first semiconductor chip 300 may be a logic chip configured to control the second semiconductor chips 100A to 100G, memory chips.

In the present example embodiment, as illustrated in FIG. 8, a pitch P2 of the dummy pads 356 may be different from a pitch P1 of the first back-surface pads 354A and the first back-surface dummy pad 354B. Thus, a density of the dummy pads 356 (a sum of areas of dummy pads compared to an area of a second region) may be different from a density of the first back-surface pads 354A and the first back-surface dummy pad 354B (a sum of areas of connection pads compared to an area of a first region). For example, the density of the dummy pads 356 may be in a range from about 50% to about 150% of the density of the first back-surface pads 354A and the first back-surface dummy pad 354B.

In addition, the first semiconductor chip 300 may further include at least one alignment key pad AK disposed on the back surface of the first semiconductor substrate 310 in a second region of the first back-surface insulating layer 364. The alignment key pad AK used in the present example embodiment may be illustrated, for example, as having a cross shape, but may have various shapes and sizes different from those of the dummy pads 356. An additional metal oxide film 357 may also be disposed on the cross-shaped alignment key pad AK.

The semiconductor package 500A according to the present example embodiment may further include a heat conductive material layer 192 and the heat proof plate 190 sequentially disposed on an upper surface of an uppermost second semiconductor chip 100G. The heat conductive material layer 192 may be disposed between the heat proof plate 190 and the uppermost second semiconductor chip 100G, and may be on and at least partially cover the upper surface of the uppermost second semiconductor chip 100G. The heat conductive material layer 192 may assist in smoothly dissipating heat generated by the semiconductor chips 300 and 100A to 100G to the heat proof plate 190. The heat conductive material layer 192 may be formed of a thermal interface material (TIM). For example, the heat conductive material layer 192 may be formed of an insulating material or a material capable of maintaining electrical insulation by including an insulating material. The heat conductive material layer 192 may include, for example, an epoxy resin. Specific examples of the heat conductive material layer 192 may include mineral oil, grease, gap filler putty, phase change gel, a phase change material pad, and/or particle filled epoxy.

The heat proof plate 190 may be disposed on the heat conductive material layer 192. The heat proof plate 190 may be, for example, a heat sink, a heat spreader, a heat pipe, and/or a liquid cooled cold plate.

Figure 9:
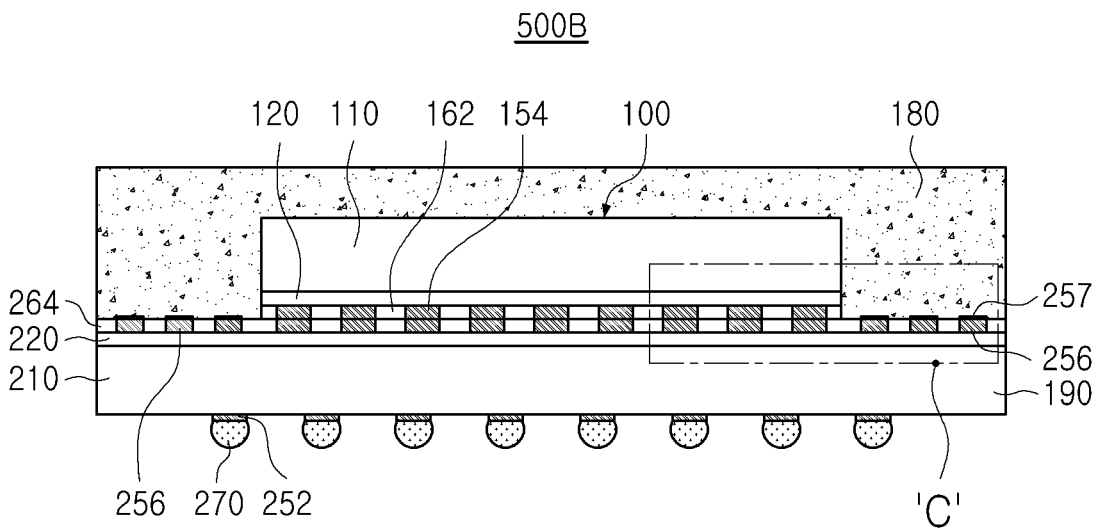
FIG. 9 is a side cross-sectional view illustrating a semiconductor package according to an example embodiment of the present disclosure.
Figure 10:
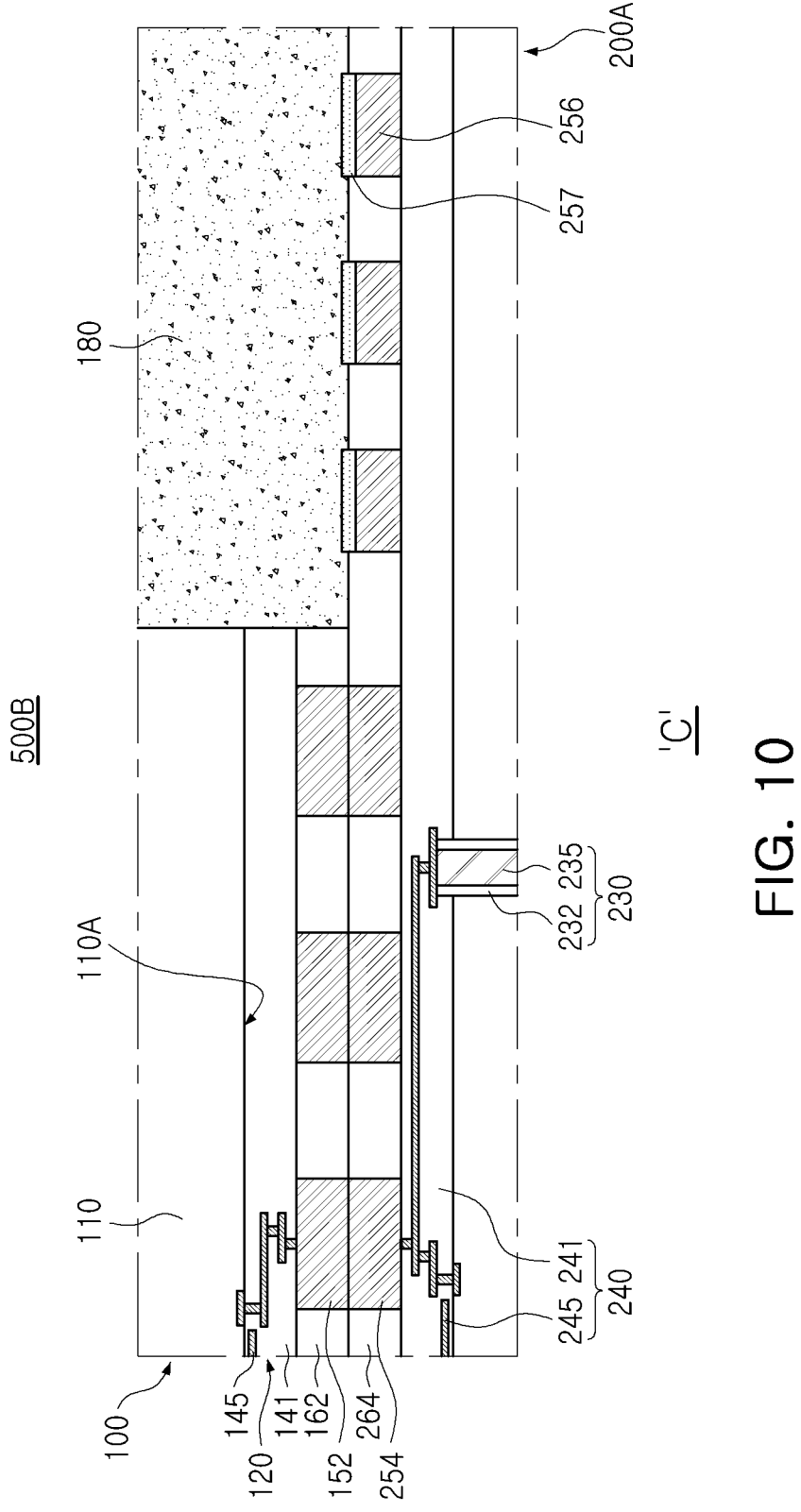
FIG. 10 is a partially enlarged view illustrating a portion "C" in the semiconductor package of FIG. 9.
Figure 11:
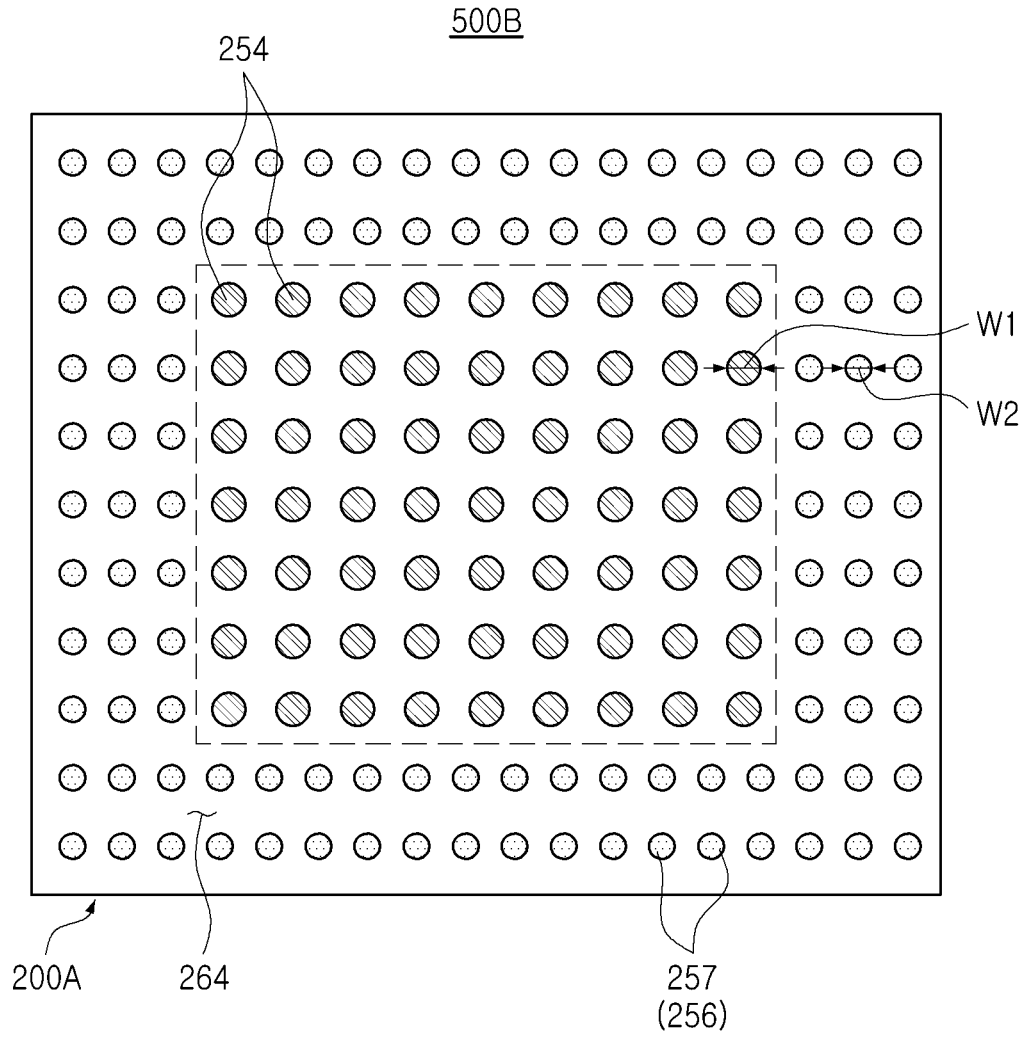
FIG. 11 is a top plan view illustrating a base structure used in the semiconductor package of FIG. 9.

FIG. 9 is a side cross-sectional view illustrating a semiconductor package according to an example embodiment of the present disclosure. FIG. 10 is a partially enlarged view illustrating a portion "C" in the semiconductor package of FIG. 9. FIG. 11 is a top plan view illustrating a base structure used in the semiconductor package of FIG. 9.

A semiconductor package 500B according to the present example embodiment may be understood as having a structure similar to that in the example embodiments illustrated in FIGS. 1 and 2, except that a first semiconductor chip 200A having a first area and second semiconductor chips 100 each having a second area smaller than the first area are included, and the dummy pads 256 have a width narrower than that of other pads 152 and 254. Accordingly, the description of the example embodiments illustrated in FIGS. 1 and 2 may be combined with the description of the present example embodiment, unless otherwise specified.

The first semiconductor chip 200A may have an area larger than that of the second semiconductor chip 100 and may be a different type of semiconductor chip. The first semiconductor chip 200A and the second semiconductor chip 100 may have components similar to those of the first semiconductor chip 300 and the second semiconductor chips 100A to 100G illustrated in FIGS. 6 and 7, respectively.

In the present example embodiment, the first semiconductor chip 200A may include a wiring structure 240 disposed on an upper surface of a first semiconductor substrate 210, a first through-electrode 230 extending through the first semiconductor substrate 210 and connected to a wiring layer 245 of the wiring structure 240 and an external connection pad 252, a first back-surface insulating layer 264 disposed on the wiring structure 240, and first back-surface pads 254 respectively connected to the wiring layer 245 in the back-surface insulating layer 264.

The second semiconductor chip 100 may include the second semiconductor substrate 110, the semiconductor device layer 120 disposed on the front surface of the second semiconductor substrate 110, the second front-surface insulating layer 162 disposed on the semiconductor device layer 120 and bonded to the first back-surface insulating layer 264, and the second front-surface pads 152 connected to the wiring layer 145 in the front-surface insulating layer 120 and bonded to the first back-surface pads 254. Thus, when an additional semiconductor chip is not stacked on an upper surface of the second semiconductor chip 100, the second semiconductor chip 100 may not further include a through-electrode and back-side pads.

In addition, the first semiconductor chip 200A may include the dummy pads 256 in an upper surface region thereof around the second semiconductor chip 100. The metal oxide film 257 may be formed on upper surfaces of the dummy pads 256. The metal oxide film 257 may be in direct contact with the molded layer 180 to ensure strong bonding.

In the present example embodiment, as illustrated in FIG. 11, a width W2 of the dummy pads 256 may be different from a width W1 of the first back-surface pads 254. Thus, a density of the dummy pads 256 may be different from a density of the first back-surface pads 254. For example, the density of the dummy pads 356 may be in a range from about 50% to about 150% of the density of the first back-surface pads 354A and the first back-surface dummy pad 354B.

FIG. 12A to 12D are cross-sectional views illustrating a main process of a method of manufacturing a semiconductor package according to an example embodiment of the present disclosure.

Figure 12A:
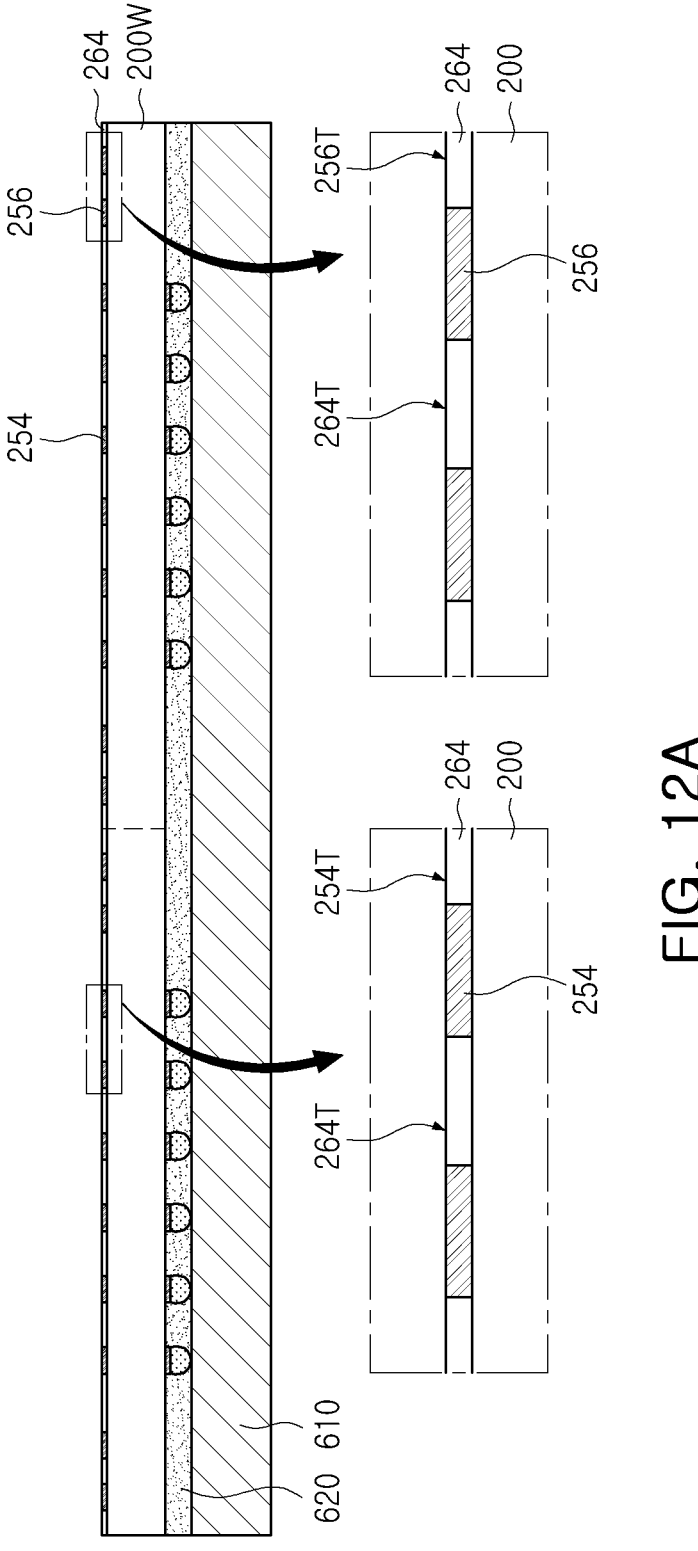
FIG. 12A to 12D are cross-sectional views illustrating a main process of a method of manufacturing a semiconductor package according to an example embodiment of the present disclosure.

Referring to FIG. 12A, a semiconductor wafer 200W for a plurality of base structures 200 may be prepared.

The semiconductor wafer 200W is illustrated as including two base structures 200. Each base structure 200 may include the external connection pad 252 disposed on a lower surface thereof, the base insulating layer 264 disposed on an upper surface thereof, a connection pad 254 disposed in the base insulating layer 264, and the dummy pad 256. The connection pad 254 may be disposed in a mounting region (for example, a first region), and the dummy pad 256 may be disposed in a peripheral region (for example, a second region) of the mounting region.

The semiconductor wafer 200W on which one or more conductive bumps 270 are formed may be attached to a carrier substrate 610 by an adhesive layer 620. The semiconductor wafer 200W may be attached onto the carrier substrate 610, such that the conductive bumps 270 face the carrier substrate 610. The conductive bumps 270 may be covered by the adhesive layer 620. A portion of a lower surface of the semiconductor wafer 200W on which the conductive bumps 270 are not formed may be bonded to the adhesive layer 520 to be stably supported during a subsequent process.

In the present operation, the connection pad 254 may have an upper surface 254T substantially coplanar with an upper surface 264T of the back-surface insulating layer 264. Similarly, the dummy pad 256 may have an upper surface 256T substantially coplanar with the upper surface 264T of the back-surface insulating layer 264. The planar upper surfaces may be formed by a planarization process, such as a CMP process.

In such a planarization process, the dummy pads 256 disposed in the peripheral region may reduce or prevent dielectric erosion occurring in the mounting region in which the connection pad 254 is positioned, and may improve planarization quality of a bonding surface.

The dummy pads 256 may be manufactured in a process the same as that of the connection pads 254. In some example embodiments, the dummy pads 256 may include a same metal as that of the connection pads 254. For example, the dummy pads 256 and the connection pads 254 may include copper, respectively.

In some example embodiments, a through-via or an internal wiring electrically connecting the external connection pad 252 and the connection pad 254 to each other may be formed inside the base structure 200. The conductive bump 270, such as a solder ball, may be formed on the external connection pad 252 of the base structure 200. In the present example embodiment, the base structure 200 is illustrated as an interposer, but the base structure 200 may have a form in which a logic chip or a memory chip is implemented in accordance with different embodiments.

Figure 12B:
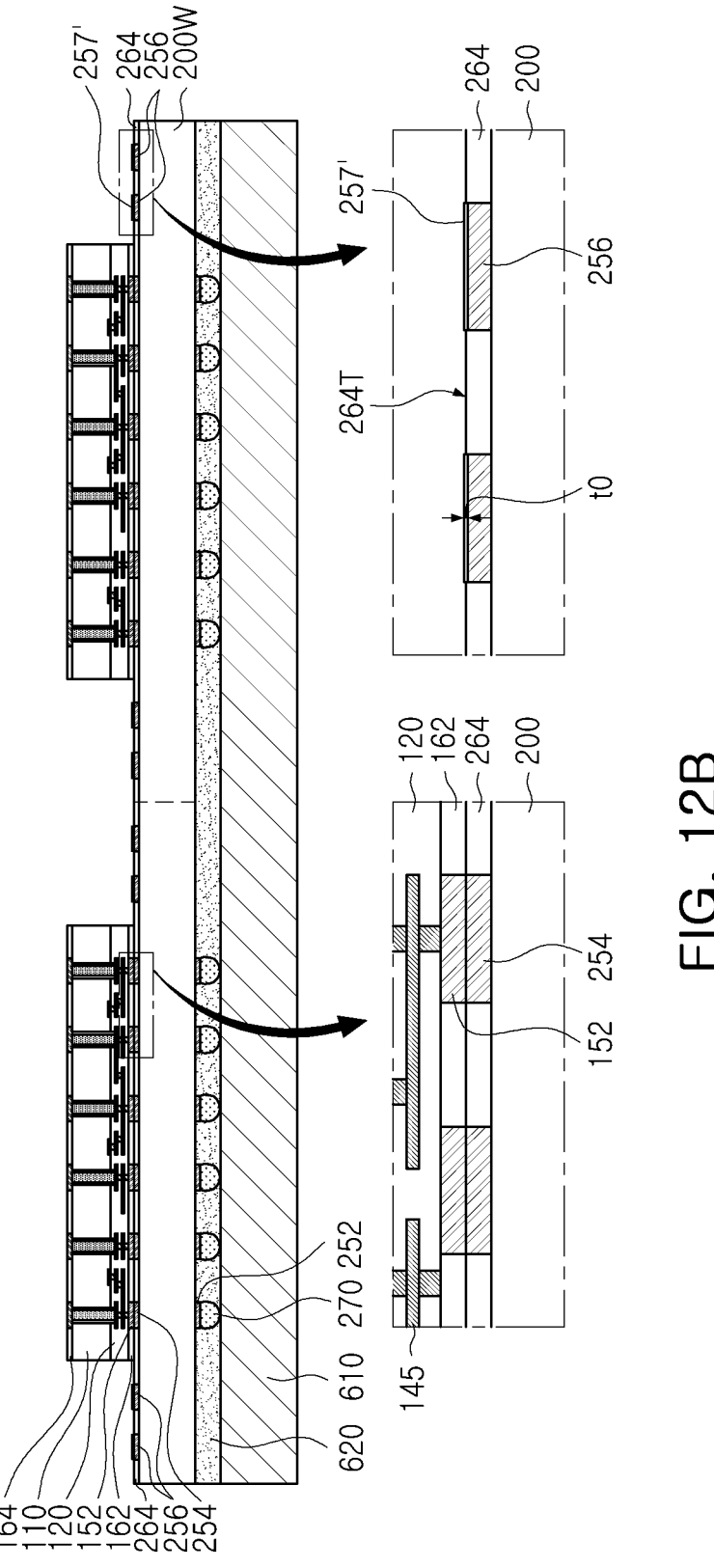

Subsequently, referring to FIG. 12B, the first semiconductor chip 100A may be disposed on each base structure 200 of the semiconductor wafer 200W.

The first semiconductor chip 100A may be directly bonded to an upper surface of the semiconductor wafer 200W. The connection pads 254 of each base structure 200 and the front-surface pads 152 of the first semiconductor chip 100A may be directly bonded to each other, and the base insulating layer 264 and the front-surface insulating layer 152 of the first semiconductor chip 100A may be directly bonded to each other.

A process of stacking the first semiconductor chip 100A may be performed in a state in which the dummy pad is externally exposed to the outside. A metal oxide film 257' may be formed on the dummy pad 256 in a series of processes, such as a cleaning process using D.I. water (for example, adsorption of OH groups), an $O_2$ plasma treatment process, and an annealing process. The metal oxide film 257 may be understood as being a product formed by partially oxidizing the metal of the dummy pad 256. A thickness t0 of the metal oxide film 257 may be relatively small (for example, about 10 nm or less).

Figure 12C:
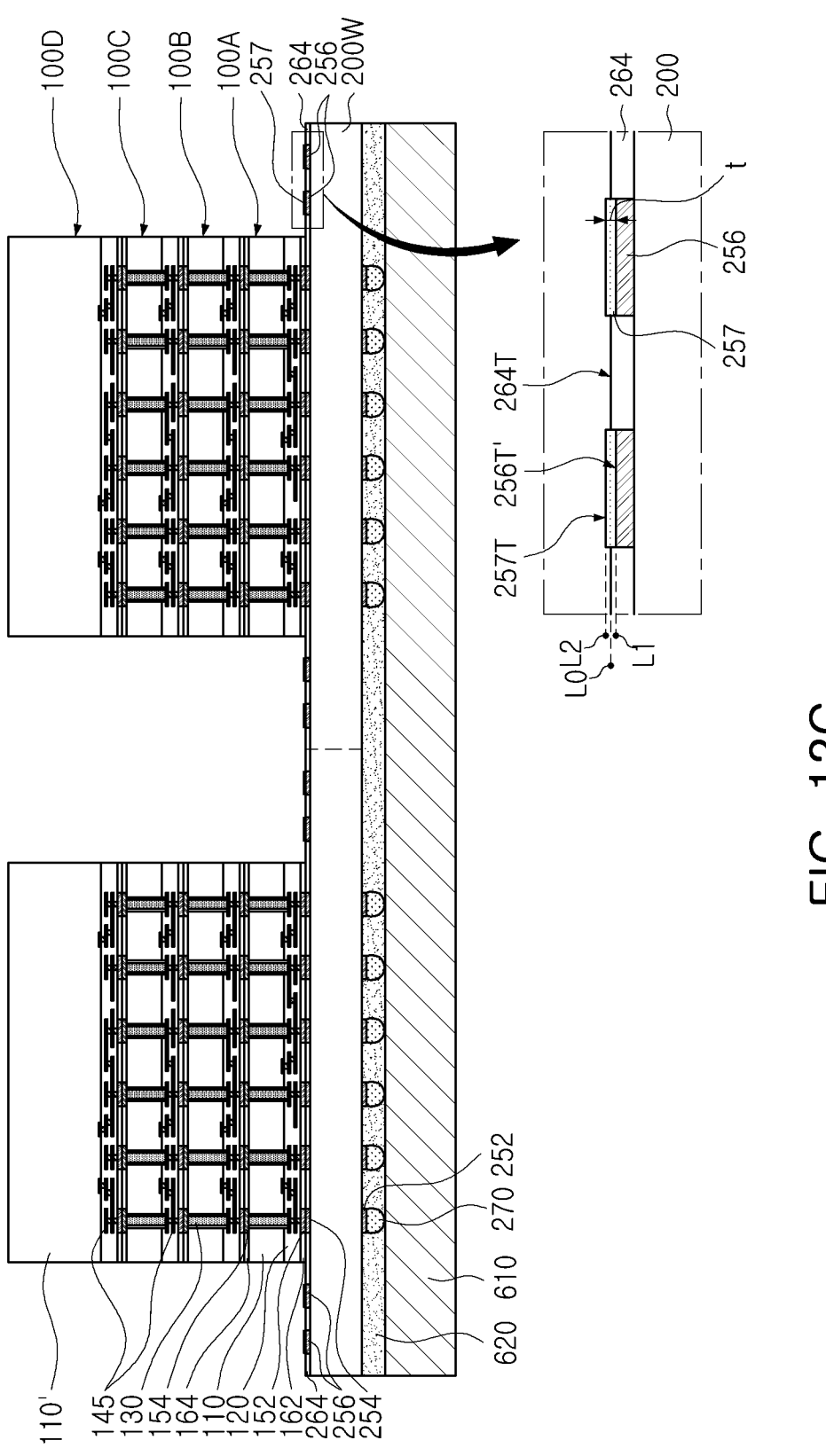

Subsequently, referring to FIG. 12C, a process of stacking an additional semiconductor chip may be performed to correspond to the desired number of chips.

A process of stacking the second to fourth semiconductor chips 100B, 100C, and 100D may be implemented in a direct bonding manner, for example, a hybrid bonding manner, in a similar manner to a process of stacking the first semiconductor chip 100A. Additional stacking processes may be repeatedly performed in a state in which the dummy pads 256 are exposed, such that a thickness t1 of the metal oxide film 257 may be increased. Bonding strength with the molded layer may be improved by the metal oxide film 257 having a desired thickness.

When the thickness t of the metal oxide film 257 is about 80 nm or less, generally high bonding strength may be exhibited. For a stable improvement effect (a minimum thickness), the thickness t of the metal oxide film 257 may be in a range of about 5 nm to about 80 nm. In some example embodiments, relatively high bonding strength may be attained by adjusting the thickness t of the metal oxide film 257 to about 10 nm to about 40 nm.

15

Figure 12D:
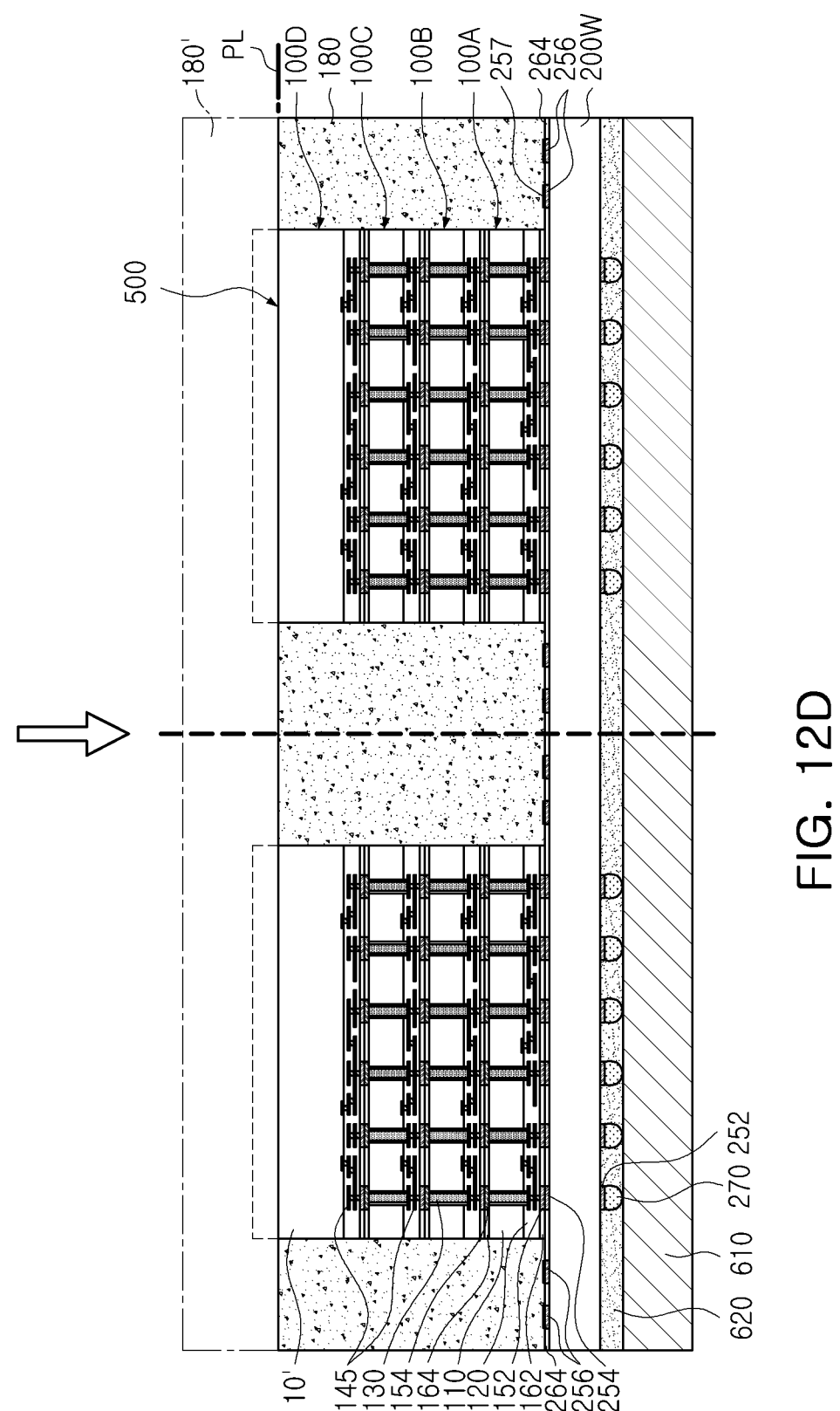

Subsequently, referring to FIG. 12D, a molded layer 180' bordering or surrounding the chip stacks CS1 may be formed on the semiconductor wafer 200W, and a grinding process may be performed to expose an upper surface of an uppermost semiconductor chip 100D.

After the grinding process, the molded layer 180 may border or surround side surfaces of the chip stack CS1 to open an upper surface of the chip stack CS1. In the present example embodiment, because the molded layer 180 is formed in a state in which the stacking process is completed, the molded layer 180 may include a single or monolithic structure formed of a single material (for example, EMC). Instead of the dummy pads 256, the metal oxide film 257 formed on the dummy pads 256 may be in direct contact with the molded layer 180 to increase bonding strength between the base structure 200 and the molded layer 180.

Subsequently, a desired semiconductor package 500 may be formed through a cutting process. By such a cutting process, the molded layer 180 may have a surface substantially coplanar with side surfaces of the base structure 200.

While example embodiments have been shown and described above, it will be apparent to those skilled in the art that modifications and variations could be made without departing from the scope of the present disclosure as defined by the appended claims.

What is claimed is:

1. A semiconductor package comprising:
a first semiconductor chip;
a plurality of second semiconductor chips stacked on the first semiconductor chip, the plurality of second semiconductor chips respectively having widths narrower than a width of the first semiconductor chip; and
a molded layer on an upper surface of the first semiconductor chip, the molded layer on side surfaces of the plurality of second semiconductor chips,
wherein the first semiconductor chip includes:
a first semiconductor substrate, a first semiconductor device layer on a front surface of the first semiconductor substrate, first front-surface pads on the first semiconductor device layer, a first back-surface insulating layer on a back surface of the first semiconductor substrate and divided into a first region and a second region, first back-surface pads in the first region of the first back-surface insulating layer, dummy pads in the second region of the first back-surface insulating layer, the dummy pads respectively having an upper surface with a metal oxide film thereon, and a first through-electrode extending through the first semiconductor substrate and electrically connecting the first front-surface pads and the first back-surface pads to each other,
wherein the plurality of second semiconductor chips respectively includes:
a second semiconductor substrate, a second semiconductor device layer on a front surface of the second semiconductor substrate, a second front-surface insulating layer on the second semiconductor device layer, second front-surface pads in the second front-surface insulating layer, a second back-surface insulating layer on a back surface of the second semiconductor substrate, second back-surface pads in the second back-surface insulating layer, and a second through-electrode extending through the second semiconductor substrate and electrically connecting the second front-surface pads and the second back-surface pads to each other,

wherein the second front-surface insulating layer of a lowermost second semiconductor chip among the plurality of second semiconductor chips is bonded to the first back-surface insulating layer, and the second front-surface pads of the lowermost second semiconductor chip are bonded to the first back-surface pads, respectively.

2. The semiconductor package of claim 1, wherein the first back-surface pads have an upper surface coplanar with an upper surface of the first back-surface insulating layer, and the second front-surface pads have an upper surface coplanar with an upper surface of the second front-surface insulating layer.

3. The semiconductor package of claim 1, wherein the plurality of second semiconductor chips is stacked in a first direction, and
wherein the metal oxide film of each of the dummy pads has an upper surface higher in the first direction than an upper surface of the first back-surface insulating layer.

4. The semiconductor package of claim 1, wherein the metal oxide film includes an oxide containing a metal included in each of the dummy pads.

5. The semiconductor package of claim 1, wherein
the first semiconductor chip further includes first back-surface dummy pads on the back surface of the first semiconductor substrate in the first region of the first back-surface insulating layer, and
the lowermost second semiconductor chip is on the front surface of the second semiconductor substrate in the second front-surface insulating layer, and further includes second front-surface dummy pads respectively bonded to the first back-surface dummy pads.

6. The semiconductor package of claim 1, wherein
the first semiconductor chip further includes at least one alignment key pad on the back surface of the first semiconductor substrate in the second region of the first back-surface insulating layer, and
an additional metal oxide film is on the at least one alignment key pad.

7. The semiconductor package of claim 1, wherein the metal oxide film is in direct contact with the molded layer.

8. The semiconductor package of claim 1, wherein the molded layer includes a monolithic structure formed of a single material.

9. The semiconductor package of claim 1, wherein the second back-surface insulating layer of each of the plurality of second semiconductor chips is bonded to a second front-surface insulating layer of another adjacent one of the plurality of second semiconductor chips, and the second back-surface pads of each of the plurality of second semiconductor chips are respectively bonded to second front-surface pads of another adjacent one of the plurality of second semiconductor chips.

10. The semiconductor package of claim 1, wherein each of the plurality of second semiconductor chips is a same type of semiconductor chip, which is different from that of the first semiconductor chip.

11. The semiconductor package of claim 10, wherein
the first semiconductor chip includes a logic chip, and
the plurality of second semiconductor chips includes memory chips, respectively.

12. The semiconductor package of claim 1, wherein
a third semiconductor chip on an uppermost second semiconductor chip among the plurality of second semiconductor chips, and
the third semiconductor chip includes:
a third semiconductor substrate;

a third semiconductor device layer on a front surface of the third semiconductor substrate;

a third front-surface insulating layer on the third semiconductor device layer and bonded to a second back-surface insulating layer of the uppermost second semiconductor chip; and second front-surface pads in the third front-surface insulating layer and respectively bonded to second back-surface pads of the uppermost second semiconductor chip.

13. A semiconductor package comprising:

a base structure having an upper surface divided into a first region and a second region, the base structure including a base insulating layer on the upper surface, connection pads bordered by the base insulating layer and arranged on the first region, and dummy pads bordered by the base insulating layer, arranged on the second region, each of the dummy pads having an upper surface on which a metal oxide film is disposed;

at least one semiconductor chip on the first region of the base structure, the at least one semiconductor chip including a semiconductor substrate, a semiconductor device layer on a front surface of the semiconductor substrate, a front-surface insulating layer on the semiconductor device layer and bonded to the base insulating layer in the first region, and front-surface pads bordered by the front-surface insulating layer and respectively bonded to the connection pads; and a molded layer on the base structure and bordering side surfaces of the at least one semiconductor chip.

14. The semiconductor package of claim 13, wherein an upper surface of the metal oxide film is higher than upper surfaces of the connection pads in a direction perpendicular to a plan defined by the upper surface of the base structure.

15. The semiconductor package of claim 13, wherein the metal oxide film has a thickness of about 5 nm to about 80 nm.

16. The semiconductor package of claim 13, wherein the base structure includes a substrate having a wiring circuit.

17. The semiconductor package of claim 13, wherein the base structure includes a semiconductor chip of a different type from that of the at least one semiconductor chip.

18. A semiconductor package comprising:

a first semiconductor chip having an upper surface and a lower surface, the upper surface being divided into a first region and a second region bordering the first region;

a plurality of second semiconductor chips stacked on the first region of the upper surface of the first semiconductor chip, the plurality of second semiconductor chips being a same type of semiconductor chip, which is different from that of the first semiconductor chip; and a molded layer on the first semiconductor chip and bordering side surfaces of the plurality of second semiconductor chips, wherein the first semiconductor chip includes:

a protective layer on a lower surface of the first semiconductor chip, external connection pads on the protective layer, a first upper insulating layer on an upper surface of the first semiconductor chip, first upper pads on the first region of the upper surface in the first upper insulating layer, dummy pads on the second region of the upper surface in the first upper insulating layer, and metal oxide films respectively on the dummy pads, wherein the plurality of second semiconductor chips respectively includes:

a semiconductor substrate, a semiconductor device layer on a front surface of the semiconductor substrate, a front-surface insulating layer on the semiconductor device layer, front-surface pads in the front-surface insulating layer, a back-surface insulating layer on a back surface of the semiconductor substrate, back-surface pads in the back-surface insulating layer, and a through-electrode extending through the semiconductor substrate and electrically connecting the front-surface pads and the back-surface pads to each other, and wherein a front-surface insulating layer of a lowermost second semiconductor chip among the plurality of second semiconductor chips is bonded to the first upper insulating layer, and front-surface pads of the lowermost second semiconductor chip are respectively bonded to the first upper pads.

19. The semiconductor package of claim 18, wherein the plurality of second semiconductor chips is stacked in a first direction, the first upper pads have an upper surface coplanar with an upper surface of the first upper insulating layer, and the metal oxide film has an upper surface higher in the first direction than the upper surface of the first upper insulating layer.

20. The semiconductor package of claim 18, wherein the first upper pads and the dummy pads respectively include copper, and the metal oxide film includes copper oxide.

* * * * *